United States Patent
Norton, Jr. et al.

(10) Patent No.: US 12,405,166 B2
(45) Date of Patent: Sep. 2, 2025

(54) DETECTING IMPACT AND HEAT EVENTS ON PRODUCTS AND GENERATING A DIAGNOSIS

(71) Applicant: Lenovo (United States) Inc., Morrisville, NC (US)

(72) Inventors: Robert James Norton, Jr., Raleigh, NC (US); Thorsten Stremlau, Morrisville, NC (US); Kevin W. Beck, Raleigh, NC (US)

(73) Assignee: Lenovo (United States) Inc., Morrisville, NC (US)

( * ) Notice: Subject to any disclaimer, the term of this patent is extended or adjusted under 35 U.S.C. 154(b) by 635 days.

(21) Appl. No.: 17/696,554

(22) Filed: Mar. 16, 2022

(65) Prior Publication Data
US 2023/0296440 A1    Sep. 21, 2023

(51) Int. Cl.
| | |
|---|---|
| *G01J 5/60* | (2006.01) |
| *B65D 79/02* | (2006.01) |
| *G01J 5/00* | (2022.01) |
| *G01J 5/02* | (2022.01) |
| *G01J 5/48* | (2022.01) |
| *G01K 11/12* | (2021.01) |
| *G01P 15/04* | (2006.01) |
| *G09F 3/00* | (2006.01) |
| *G09F 3/02* | (2006.01) |
| *G01L 5/00* | (2006.01) |
| *G01N 31/22* | (2006.01) |
| *G01P 15/03* | (2006.01) |
| *H05K 5/02* | (2006.01) |

(52) U.S. Cl.
CPC ............ *G01J 5/0096* (2013.01); *B65D 79/02* (2013.01); *G01J 5/0265* (2013.01); *G01J 5/48* (2013.01); *G01J 5/60* (2013.01); *G01K 11/12* (2013.01); *G09F 3/0291* (2013.01); *G01J 2005/0077* (2013.01); *G01L 5/0052* (2013.01); *G01N 31/229* (2013.01); *G01P 15/036* (2013.01); *G01P 15/04* (2013.01); *H05K 5/0252* (2013.01)

(58) Field of Classification Search
CPC ...... G01P 15/0036; G01P 15/04; G01P 15/06; G01P 15/036; G01K 1/02; G01K 1/022; G01J 5/0096; G01N 31/229; G01N 21/81; G01L 1/24; G01L 5/0052; G09F 3/0291; G09F 3/0292; G09F 3/0294; B65D 79/02; H05K 5/0252; H05K 5/03
See application file for complete search history.

(56) References Cited

U.S. PATENT DOCUMENTS

| | | | | |
|---|---|---|---|---|
| 4,068,613 | A * | 1/1978 | Rubey | G01P 15/06 116/203 |
| 4,177,751 | A * | 12/1979 | Rubey | G01P 15/04 116/203 |
| 5,323,729 | A * | 6/1994 | Rubey | G01P 15/036 116/203 |
| 5,703,734 | A * | 12/1997 | Berberich | G11B 25/043 360/99.18 |

(Continued)

*Primary Examiner* — Randy W Gibson
(74) *Attorney, Agent, or Firm* — Kunzler Bean & Adamson

(57) ABSTRACT

For generating a diagnosis, a method irradiates a product surface of a product with infrared light, the product surface including a stress sensitive pigment. The method detects an activation of the stress sensitive pigment as a color change at an infrared visible activation location. The method generates a diagnosis based on the activation.

17 Claims, 5 Drawing Sheets

(56) References Cited

U.S. PATENT DOCUMENTS

| | | | | |
|---|---|---|---|---|
| 7,517,146 | B2* | 4/2009 | Smith | G01K 11/06 |
| | | | | 374/102 |
| 8,397,551 | B2* | 3/2013 | King | G01L 5/14 |
| | | | | 73/35.14 |
| 10,871,405 | B2* | 12/2020 | Vahey | G01J 5/601 |
| 11,241,902 | B1* | 2/2022 | Smith | B42D 25/29 |
| 11,247,825 | B2* | 2/2022 | Ward | G01P 15/036 |
| 11,391,751 | B2* | 7/2022 | Zimmermann | G01P 15/006 |
| 11,738,587 | B2* | 8/2023 | Smith | B42D 25/378 |
| | | | | 374/106 |
| 11,951,761 | B2* | 4/2024 | Smith | G01N 21/78 |
| 2007/0194943 | A1* | 8/2007 | Fitzer | H04M 1/18 |
| | | | | 340/686.1 |
| 2008/0099479 | A1* | 5/2008 | Liu | B65D 79/02 |
| | | | | 340/568.1 |
| 2009/0044744 | A1* | 2/2009 | Koene | C09D 7/60 |
| | | | | 252/301.16 |
| 2009/0145347 | A1* | 6/2009 | Nakamura | G01N 21/81 |
| | | | | 116/216 |
| 2014/0318436 | A1* | 10/2014 | Schonberg | G01L 5/0052 |
| | | | | 116/203 |
| 2016/0131552 | A1* | 5/2016 | Naumann | G01P 15/0891 |
| | | | | 73/12.01 |
| 2019/0094257 | A1* | 3/2019 | Wardrup | G01P 15/038 |

* cited by examiner

DETECTING IMPACT AND HEAT EVENTS ON PRODUCTS AND GENERATING A DIAGNOSIS

FIELD

The subject matter disclosed herein relates to detecting impact and heat events and generating a diagnosis.

BACKGROUND

Products may be damaged by impact or heat.

BRIEF SUMMARY

A method for generating a diagnosis is disclosed. The method irradiates a product surface of a product with infrared light, the product surface including a stress sensitive pigment. The method detects an activation of the stress sensitive pigment as a color change at an infrared visible activation location. The method generates a diagnosis based on the activation. An apparatus and system also perform the functions of the method.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1A:
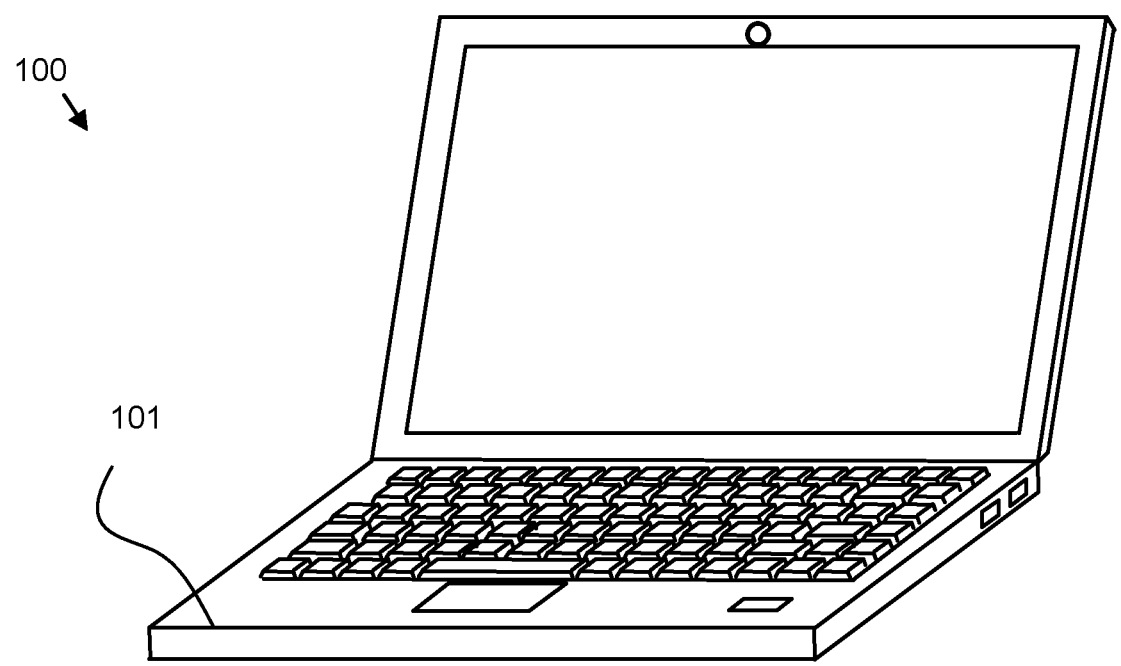
FIG. 1A is a perspective drawing illustrating one embodiment of an electronic device.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In a certain embodiment, the storage devices only employ signals for accessing code.

Many of the functional units described in this specification have been labeled as modules, in order to more particularly emphasize their implementation independence. For example, a module may be implemented as a hardware circuit comprising custom very large scale integrated ("VLSI") circuits or gate arrays, off-the-shelf semiconductors such as logic chips, transistors, or other discrete components. A module may also be implemented in programmable hardware devices such as a field programmable gate array ("FPGA"), programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules and may be embodied in any suitable form and organized within any suitable type of data structure. The operational data may be collected as a single data set or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing.

More specific examples (a non-exhaustive list) of the storage device would include the following: an electrical connection having one or more wires, a portable computer diskette, a hard disk, a random-access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Code for carrying out operations for embodiments may be written in any combination of one or more programming languages including an object oriented programming language such as Python, Ruby, R, Java, Java Script, Smalltalk, C++, C sharp, Lisp, Clojure, PHP, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The embodiments may transmit data between electronic devices. The embodiments may further convert the data from a first format to a second format, including converting the data from a non-standard format to a standard format and/or converting the data from the standard format to a non-standard format. The embodiments may modify, update, and/or process the data. The embodiments may store the received, converted, modified, updated, and/or processed data. The embodiments may provide remote access to the data including the updated data. The embodiments may make the data and/or updated data available in real time. The embodiments may generate and transmit a message based on the data and/or updated data in real time. The embodiments may securely communicate encrypted data. The embodiments may organize data for efficient validation. In addition, the embodiments may validate the data in response to an action and/or a lack of an action.

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise. The term "and/or" indicates embodiments of one or more of the listed elements, with "A and/or B" indicating embodiments of element A alone, element B alone, or elements A and B taken together.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

FIG. 1A is a perspective drawing illustrating one embodiment of a product 100. In the depicted embodiment, the product 100 is a laptop computer. Alternatively, the product 100 may be a mobile telephone, a tablet computer, a desktop computer, a camera, and the like. The product 100 includes a product surface 101.

The product 100 may be damaged by heat and/or impact. For example, dropping the product 100 may damage internal compliments. Unfortunately, heat and/or impact events are usually not recorded in product logs. As a result, important information is not available when diagnosing a product fault.

The embodiments include a stress sensitive pigment in the product surface. The stress sensitive pigment may be activated in response to heat and/or impact. The stress sensitive pigment may be irradiated with an infrared light to detect the activation. The detected activation may be used to generate a diagnosis for the product 100 as will be described hereafter. As a result, product faults are diagnosed more efficiently.

Figure 1B:
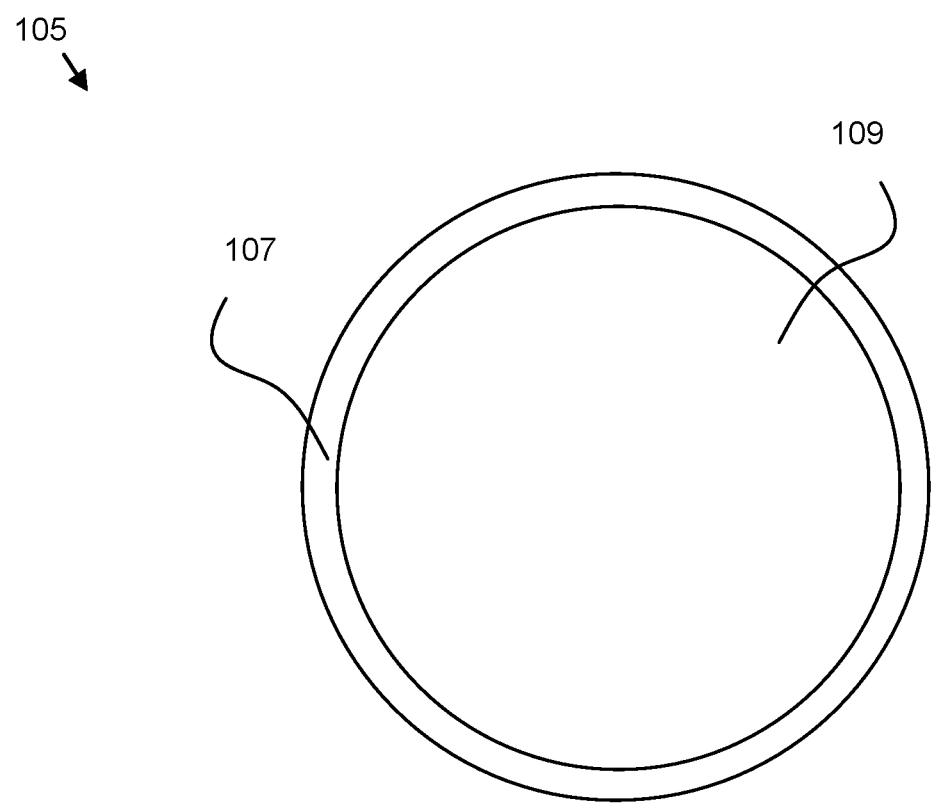
FIG. 1B is a cut away drawing illustrating one embodiment of an encapsulated stress sensitive pigment.

FIG. 1B is a cut away drawing illustrating one embodiment of an encapsulated stress sensitive pigment 105. In the depicted embodiment, a stress sensitive pigment 109 is encapsulated in a capsule 107. The capsule 107 may be opaque. The capsule 107 may prevent the stress sensitive pigment 109 from being detected if exposed to infrared light. The capsule 107 may rupture in response to heat and/or impact, releasing the stress sensitive pigment 109. Table 1 lists some combinations of minimum conditions that may rupture the capsule 107.

TABLE 1

| Heat (degrees Celsius) | Impact (Newton seconds) |
|---|---|
| 50 | any |
| 60 | any |
| 70 | any |
| any | 600 |
| any | 700 |
| any | 800 |
| 40 | 300 |
| 50 | 200 |

After the capsule 107 ruptures, the stress sensitive pigment 109 may be visible. The stress sensitive pigment 109 may be visible if irradiated with infrared light.

One embodiment, the stress sensitive pigment 109 is not encapsulated. The stress sensitive pigment 109 may become activated and visible if irradiated with infrared light in response to being subjected to the stresses of Table 1. In one embodiment, the activation is irreversible.

Figure 2A:
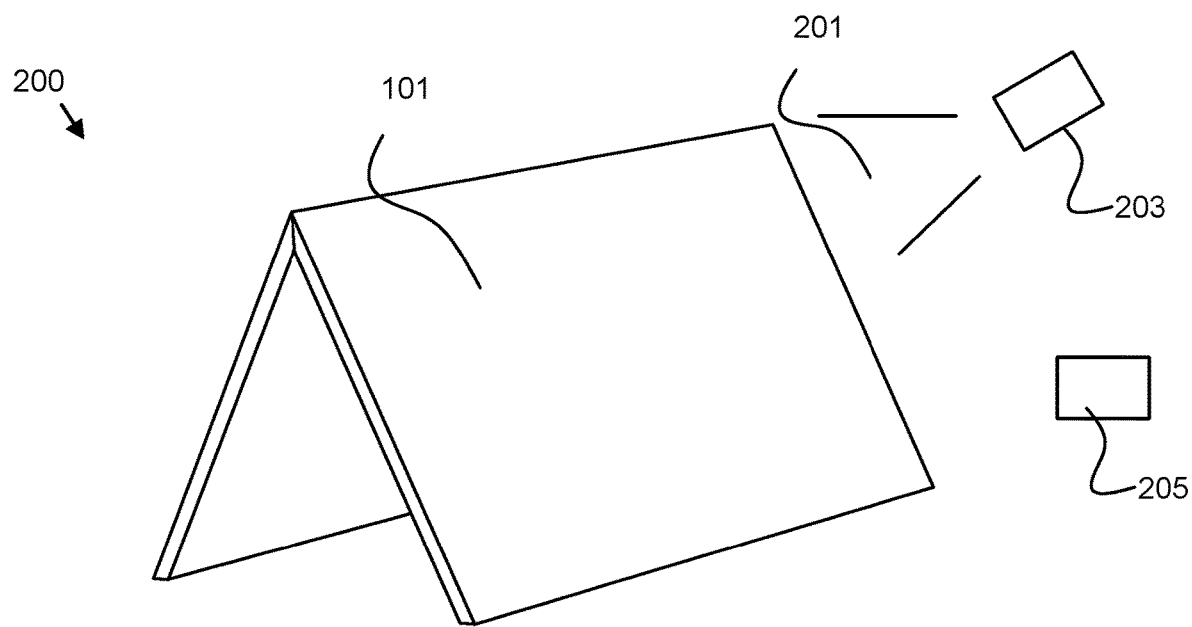
FIG. 2A is a perspective drawing illustrating one embodiment of activation detection.

FIG. 2A is a perspective drawing illustrating one embodiment of activation detection using a detection system 200. In the depicted embodiment, a product surface 101 is irradiated with infrared light 201. The infrared light 201 may be generated by an infrared light source 203. A camera 205 may scan the product surface 101 to detect activation of the stress sensitive pigment 109.

Figure 2B:
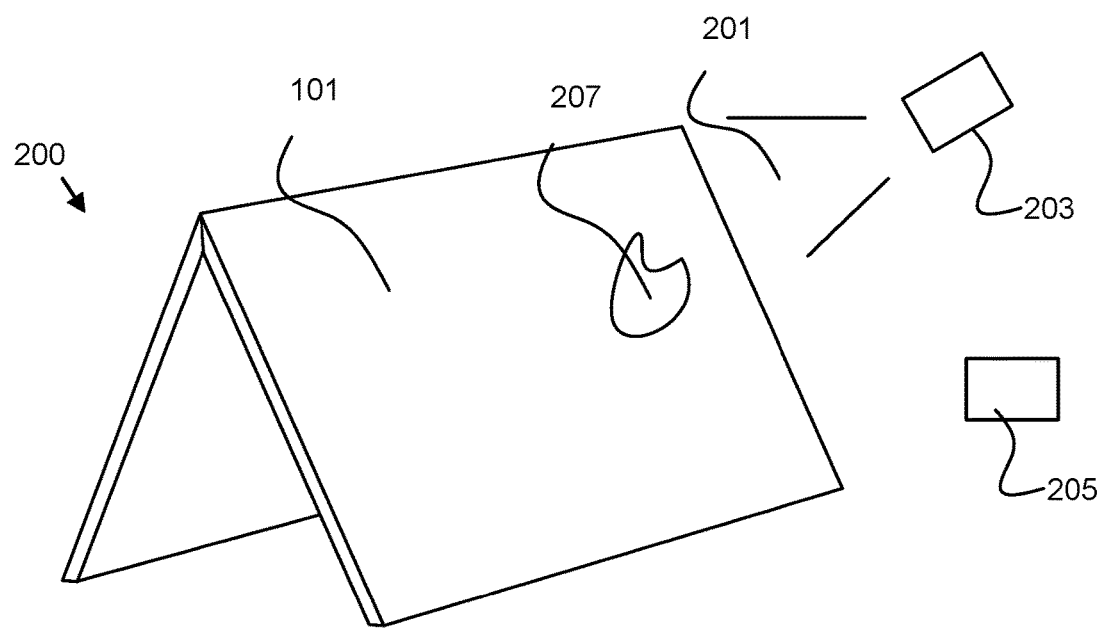
FIG. 2B is a perspective drawing illustrating one alternate embodiment of activation detection.

FIG. 2B is a perspective drawing illustrating one alternate embodiment of activation detection using the detection system 200 of FIG. 2A. in the depicted embodiment, the infrared light 201 makes visible the stress sensitive pigment 109, creating an activation 207. The camera 205 may capture the activation 207. The camera 205 may capture a surface image of the activation 207.

Figure 3:
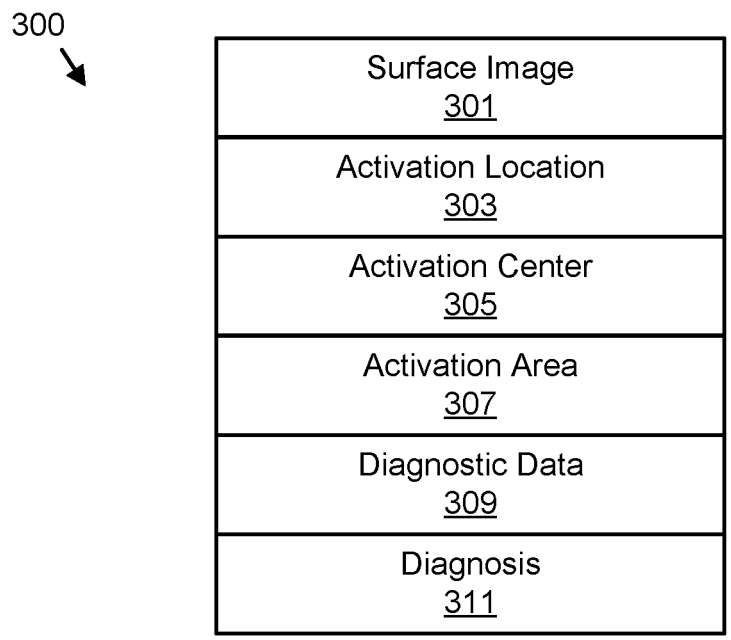
FIG. 3 is a schematic block diagram illustrating one embodiment of activation data.

FIG. 3 is a schematic block diagram illustrating one embodiment of activation data 300. The activation data 300 may be used to record the activation 207 of the stress sensitive pigment 109. In addition, the activation data 300 may be used to generate a diagnosis 311 based on the activation 207. The activation data 300 may be organized as a data structure in a memory. In the depicted embodiment, the activation data 300 includes a surface image 301, an activation location 303, an activation center 305, an activation area 307, diagnostic data 309, and the diagnosis 311.

The surface image 301 is an image of the product surface 101. The surface image 301 may be captured by the camera 205. The activation location 303 may record the location of the activation 207. The activation location 303 may be mapped to the product surface 101.

The activation center 305 may record a center of the activation location 303. The activation center 305 may be a weighted average of activation pixels in the surface image 301. The activation area 307 may record an area of the activation location 303. The activation area 307 may some the activation pixels in the surface image 301.

The diagnostic data 309 may be received for the product 100. The diagnostic data 309 may include but is not limited to product logs for the product 100, the results of diagnostic tests run on the product 100, comments submitted by a user, observations of the technician, and the like.

The diagnosis 311 may be generated for the product 100. The diagnosis 311 may be based on the activation 207. In addition, the diagnosis 311 may be based on the activation 207 and the diagnostic data 309.

In one embodiment, the diagnosis 311 comprises an estimated remaining life, an estimated value, and/or a failure mechanism. The diagnosis 311 may be selected from the group consisting of the estimated remaining life, the estimated value, and the failure mechanism.

The estimated remaining life may estimate a time interval during which the product 100 may continue to provide useful service. The estimated value may be a resale value, and internal value, or the like. The failure mechanism may specify why the product 100 is not functioning as expected.

Figure 4:
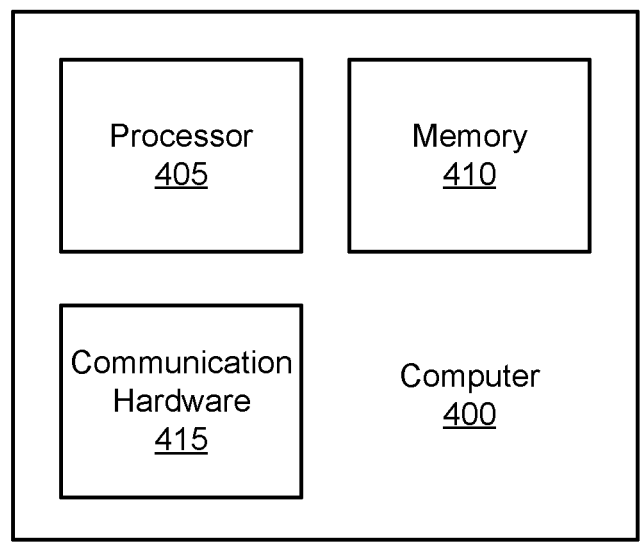
FIG. 4 is a schematic block diagram illustrating one embodiment of a computer.

FIG. 4 is a schematic block diagram illustrating one embodiment of a computer 400. In one embodiment, the computer 400 controls the infrared light source 203 and/or the camera 205. In addition, the computer 400 may generate and/or receive the diagnostic data 309. In the depicted embodiment, the computer 400 includes a processor 405, memory 410, and communication hardware 415. The memory 410 may store data and code. The processor 405 may execute the code and process the data. The communication hardware 415 may communicate with other devices such as the product 100.

Figure 5A:
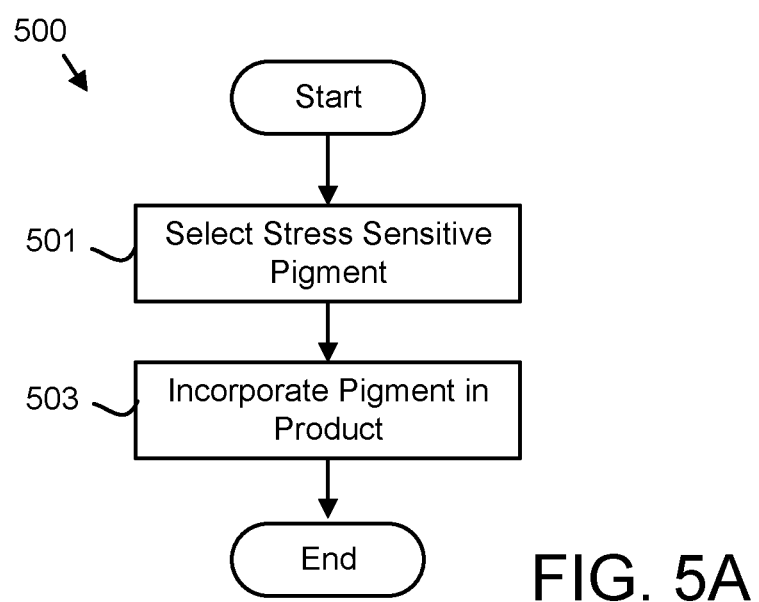
FIG. 5A is a schematic flow chart diagram illustrating one embodiment of a stress sensitive pigment incorporation method.

FIG. 5A is a schematic flow chart diagram illustrating one embodiment of a stress sensitive pigment incorporation method 500. The method 500 may incorporate the stress sensitive pigment 109 in the product 100.

The method 500 starts, and in one embodiment, the computer 400 selects 501 the stress sensitive pigment 109. The stress sensitive pigment 109 may be selected 501 based on the heat stress and/or impact stress that is likely to damage the product 100. In one embodiment, the stress sensitive pigment 109 is selected 501 using Table 1.

The selected stress sensitive pigment 109 is further incorporated 503 in the product 100. In one embodiment, the stress sensitive pigment 109 and/or encapsulated stress sensitive pigment 105 is painted on the product surface 101. In addition, the stress sensitive pigment 109 and/or encapsulated stress sensitive pigment 105 may be added to resin used to form the product 100 and/or product surface 101.

Figure 5B:
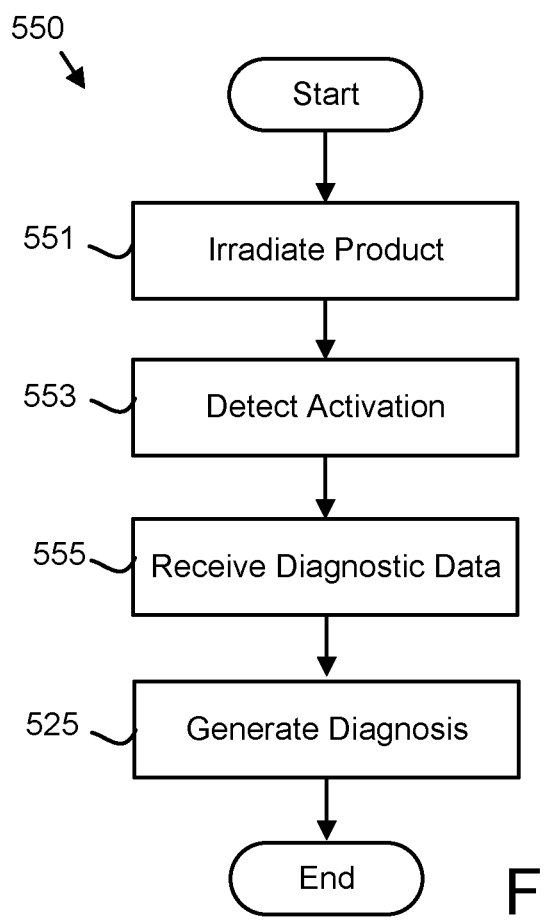
FIG. 5B is a schematic flow chart diagram illustrating one embodiment of an activation detection method.

FIG. 5B is a schematic flow chart diagram illustrating one embodiment of an activation detection method 550. The method 550 may detect the activation 207 of the stress sensitive pigment 109. In addition, the method 550 may generate the diagnosis 311 based on the activation 207. The method 550 may be performed by the activation system 200, the computer 400, and/or the processor 405.

The method 550 starts, and in one embodiment, the infrared light 201 irradiates 551 the product 100. The infrared light 201 may irradiate 551 the product surface 101. The product surface 101 comprises the stress sensitive pigment 109 and/or encapsulated stress sensitive pigment 105. The product 100 and/or product surface 101 may be a radiated 551 with infrared light 201. Alternatively, the product 100 and/or product surface 101 may be a radiated 551 with ultraviolet light. The processor 405 may control the infrared light 201.

The processor 405 may detect 553 the activation 207 of the stress sensitive pigment 109. The activation 207 may be detected 553 as a color change. The color change may be at an infrared visible activation location 303. In one embodiment, the camera 205 captures the surface image 301. The processor 405 may examine the surface image for the color change. The processor 405 may record the activation location 303, the activation center 305, and/or the activation area 307.

The processor 405 may generate 555 the diagnosis 311 based on the activation 207. The diagnosis 303 may be generated 555 based on only the activation 207, including activation location 303, the activation center 305, and/or the activation area 307. In addition, the diagnosis 311 may be based on both the activation 207 and the diagnostic data 309. For example, the diagnostic data 309 may indicate that an internal bus or a hard disk drive are potential failure mechanisms. The activation area 207 may be located over the hard disk drive. As a result, the processor 405 may generate 555 a diagnosis 311 that the hard disk drive is the failure mechanism.

The embodiments irradiate the product surface 101 with the infrared light 201 to detect the activation 207 of the stress sensitive pigment 109. The embodiments further generate the diagnosis 311 based on the activation 207. As a result, the generation of the diagnosis 311 is more efficient. In addition, the function of the computer 400 is more efficient.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   irradiating a product surface of a product with infrared light, the product surface comprising a plurality of stress sensitive hollow, opaque capsules that each enclose a pigment sensitive to infrared light and that are each configured to rupture in response to heat and/or an impact;
   detecting, using a camera, an irreversible activation of the pigment as a color change in response to the infrared light, wherein the activation comprises an activation center and an activation area; and
   generating, using a processor, a diagnosis based on the irreversible activation.

2. The method of claim 1, wherein the heat corresponds to a temperature exceeding 50 degrees Celsius.

3. The method of claim 1, wherein the impact exceeds 600 Newton seconds.

4. The method of claim 1, the method further comprising receiving diagnostic data for the product, wherein the diagnosis is based on the irreversible activation and the diagnostic data.

5. The method of claim 1, wherein the infrared light is generated by an infrared light source.

6. The method of claim 1, wherein the diagnosis comprises an estimated remaining life, an estimated value, and/or a failure mechanism.

7. An apparatus comprising:
   a processor executing code stored on a memory to perform:
   irradiating a product surface of a product with infrared light, the product surface comprising a plurality of stress sensitive, hollow, opaque capsules that each enclose a pigment sensitive to infrared light and that are each configured to rupture in response to heat and/or an impact;
   detecting an irreversible activation of the pigment as a color change in response to the infrared light, wherein the activation comprises an activation center and an activation area; and
   generating a diagnosis based on the irreversible activation.

8. The apparatus of claim 7, wherein the heat corresponds to a temperature exceeding 50 degrees Celsius.

9. The apparatus of claim 7, wherein the impact exceeds 600 Newton seconds.

10. The apparatus of claim 7, the method further comprising receiving diagnostic data for the product, wherein the diagnosis is based on the irreversible activation and the diagnostic data.

11. The apparatus of claim 7, wherein the infrared light is generated by an infrared light source and the irreversible activation is captured by a camera.

12. The apparatus of claim 7, wherein the diagnosis comprises an estimated remaining life, an estimated value, and/or a failure mechanism.

13. A system comprising:
   an infrared light that irradiates a product surface of a product, the product surface comprising a plurality of stress sensitive, hollow, opaque capsules that each enclose a pigment sensitive to infrared light and that are each configured to rupture in response to heat and/or an impact;
   a camera that captures a surface image of the product surface; and
   a processor that detects an irreversible activation of the pigment as a color change in the surface image in response to the infrared light, wherein the activation comprises an activation center and an activation area and that generates a diagnosis based on the irreversible activation.

14. The system of claim 13, wherein the heat corresponds to a temperature exceeding 50 degrees Celsius.

15. The system of claim 13, wherein the impact exceeds 600 Newton seconds.

16. The system of claim 13, the processor further receiving diagnostic data for the product, wherein the diagnosis is based on the irreversible activation and the diagnostic data.

17. The system of claim 13, wherein the diagnosis comprises an estimated remaining life, an estimated value, and/or a failure mechanism.

* * * * *